(12) United States Patent
Shcherbakov et al.

(10) Patent No.: US 7,943,237 B2
(45) Date of Patent: May 17, 2011

(54) POLYETHER-BASED FILM MATERIAL

(76) Inventors: Igor Shcherbakov, Moscow (RU);
Vladimir Sleptsov, Moscow (RU);
Vladimir Kislov, Moscow (RU)

( * ) Notice: Subject to any disclaimer, the term of this patent is extended or adjusted under 35 U.S.C. 154(b) by 158 days.

(21) Appl. No.: 11/920,300

(22) PCT Filed: Apr. 12, 2006

(86) PCT No.: PCT/RU2006/000183
§ 371 (c)(1),
(2), (4) Date: Nov. 13, 2007

(87) PCT Pub. No.: WO2006/130042
PCT Pub. Date: Dec. 7, 2006

(65) Prior Publication Data
US 2009/0061250 A1    Mar. 5, 2009

(30) Foreign Application Priority Data

May 31, 2005   (RU) ................................ 2005116487

(51) Int. Cl.
*B32B 9/00*     (2006.01)
*B05D 3/06*     (2006.01)
(52) U.S. Cl. .................... 428/408; 428/458; 427/249.7; 427/299; 427/404
(58) Field of Classification Search .................. 428/408, 428/688, 689, 699, 469, 336, 411.1, 304.4, 428/312.2, 312.8, 318.4, 319.3
See application file for complete search history.

(56) References Cited

U.S. PATENT DOCUMENTS 5,431,971 A * 7/1995 Allegret et al. ............... 428/148
2004/0247949 A1* 12/2004 Akedo et al. .................. 428/704

OTHER PUBLICATIONS

Kravets et al., Production of asymmetric track membranes by gas-discharge method, No month 2003, 174-175, pp. 821-825.*
Sakudo et al., Surface modification of PET film by plasma-based ion implantation, No month 2003, Nuclear Instruments and Methods in Physics Research B 206, pp. 687-690.*

* cited by examiner

*Primary Examiner* — Timothy M Speer
(74) *Attorney, Agent, or Firm* — Patent Jurist; Georgiy L. Khayet

(57) ABSTRACT

The invention pertains to high-molecular compound-based composite materials using carbon and can be used for anodes of electrolytic capacitors made on the elastic dielectric film base with current-carrying coating.

Polyester-base film material chiefly of polyethylene terephthalate has nanodimensional metal coating.

New is that a diamond-like layer 5-50 nm thick is placed between the modified surface of the polyester base and metal coating and a sponge metal layer 0.5-20 μm thick is made on the metal coating surface, said sponge metal layer has a surface development factor within the range of 80-400 and the diamond-like nanolayer is sp3-hybridization of amorphous carbon atoms gas-phase deposited in vacuum by means of a ion-plasmous source.

The proposed film material with a wide range of electrophysical properties is intended to be used in microelectronics and radio engineering as versatile constructional material. In particular, when used as an anode of the electrolytic capacitor its specific electric capacity is increased due to increased working voltages and adhesion between highly developed surfaces of functional nanolayers of film coating.

20 Claims, No Drawings

POLYETHER-BASED FILM MATERIAL

RELATED APPLICATIONS

This application is a nationalization under 35 U.S.C. 371 of PCT/RU2006/000183, filed Apr. 12, 2006 and published as WO 2006/130042 A1 on Dec. 7, 2006, which claimed priority under 35 U.S.C. 119 to Russian Patent Application Serial No. 2005116487, filed May 31, 2005; which applications and publication are incorporated herein by reference and made a part hereof.

The invention relates to composite materials of high-molecular carbon-based substances, and can be used for anodes of electrolytic capacitors having a dielectric elastic film base and a current-carrying coating.

Prior art includes film electrodes based on polymer with electric layers of coating on both sides and in which energy is accumulated in the thin, molecularly-dimensional, layer of space charge at the electrode/electrolyte border while external voltage applied is lower than decomposition potential of electrolyte (liquid or solid) (see, for example, Shurygina V., Super Capacitors, Magazine "Electronics: Science, Technology, Business". 2003, No. 3, page 20).

Based on a number of parameters, the invention is similar to the composite material 11-14 micro-microns thick, made on basis of polyethylene terephthalate film with metal coating of nanodimensional layers on both sides, as described in Patent RU 2210389, A 61L 15/00, 2002.

A known metallized film material is made through the roll technology in process of feeding of the polyester film through vacuum chamber, by means of deposition of metal from vapor phase with the aid of magnetron.

The disadvantage of this material is low adhesion of polyethylene terephthalate to metals, therefore the deposited layer of the amorphous metal has to be compacted by additional annealing to get the necessary granularity with high homogeneity level, which is labor-intensive, and can not technologically provide for specified characteristics in the whole length of the metallized film.

It is not possible to use this material in a practical manner as the anode of an electrolytic capacitor due to its unsatisfactory electro-physical characteristics.

The object of the present invention is to create the composite film material with a polyester base having a current-carrying metal coating, with improved electrophysical characteristics adapted to conditions of their industrial application in electrolytic capacitors as anodes.

The required technical result is achieved in the known film material having a polyester base, predominantly made from polyethylene terephthalate, with nanodimensional metal coating, in accordance with the invention, by having, between the modified surface of the polyester base and metal coating, a diamond-like layer of 5-50 nm, and wherein the surface of the metal coating is a porous metal layer of 0.520 microns having a factor of surface development in the range of 80-400, and wherein the diamond-like layer is a sp3-hybridization of atoms of amorphous carbon, deposited in vacuum from gaseous phase by means of ion-plasmous source, and having the polyester base previously modified by development of its surface and by pores made all the way through the surface of the polyester base of size of 0.2-6 microns.

In process of using of the new multi-layer film structure as the anode of electrolytic capacitor, the distinguishing characteristics are provided for the improvement of the principal desirable qualities: increase of the specific electric capacitance and mechanical properties owing to porosity of sponge metal on the surface in combination with high adhesion between functional layers of the coating on the modified, highly developed surface of the base.

The choice of the polyethylene terephthalate film for the basis of the material is determined by its characteristics (high physical-mechanical and insulating properties, thermal resistance, chemical stability, as well as resistance to galling, mashing, influence of light and microorganisms) which, in combination with the efficient roll technology of production of metal-film anodes, determine relatively low cost of the electrolytic capacitors having maximum power range.

The modification of the surface of the polyethylene terephthalate film made by means of ion treatment in atmosphere of mixture of nitrogen and oxygen (air), destroying carbonyl groups, changes its relief and increases roughness, and in that way improves the cohesion with applied coatings.

The modification of the surface of the polyester base creates the "information matrix", that is highly developed profile of the surface of the film base, which determines the geometry and interconnection form of the structure of the deposited coating, and consequently the electro-physical properties of the material on the whole.

The modification of the surface of the polyester base by geometrical relief increases the strength of cohesion with the functional coating, whereas the pores made all the way through provide for the geometrical ring-shaped locking of the two-sided metal coating.

The ion treatment of the polyester film surface creates highly developed geometrical relief and saturates it with excess energy, and in that way provides for the multiple increase of the adhesion to the functional coating made from amorphous carbon.

The placement of the diamond-like layer 5-50 nm thick between the corrugated polyester base and the nanodimensional metal coating provides for:

In the first place, barrier for the active constituents of the base polymer, which prevents their diffusion into the coating, and thus stabilizes the electro-physical characteristics of the film;

In the second place, the increase of adhesion of layers in this composite structure up to values more than 1.5 Newton/mm, as well as the increase of critical value of voltage breakdown (field intensity) by 1.5-1.7 times, which allows to increase substantially the rated parameters of the metal-film capacitors as well as their serviceability.

The diamond-like nanodimensional coating possesses semi-conducting properties and increases the dielectric permeability of the material.

The specificity of carbon atom consists in its capability for forming of strong interatomic bonding characterized by different types of hybridized electron orbits. The ties in diamond lattice are characterized by sp3-hybridized state of amorphous carbon, whereas sp2-hybridization and sp-hybridization correspond to graphite and carbine respectively.

The diamond-like layer less than 5 nm thick does not produce a noticeable improvement of the electro-physical properties of the film material, and when this layer is more than 50 nm thick the film elasticity reduces, and there is no increase of its strength.

The adhesion of the two-sided current-carrying metal coating for the most part is provided for by Van der Waals forces as well as owing to the forming of coating at the border of partition of the highly developed surface.

Production of the current-carrying coating in the form of porous metal layer 0.5-20 microns thick increases the film electrode capacity, at that its cross-oriented structure improves the sorption properties while interacting with liquid electrolyte and allows to increase iteratively the contact surface of metal-film anode of electrolytic capacitor and to reduce distinctly its external dimensions.

When factor of development of porous metal coating surface is less than 80, the electric capacitance of the film anode is not sufficient for the industrial use.

When the factor of development of this functional surface is more than 400, there are forming pores of too small dimensions, which are not filled in with electrolyte, and therefore the anode capacity is not increasing.

The pores of size less than 0.2 microns in the material polyester base do not substantially influence upon the adhesion with functional nanodimensional coating. When the ionic-plasmous deposition of the coating metal is used, the pores fill with dust and practically disappear, which has a negative influence upon the sorption properties of the material and reduces the electric capacity of the anode made from it.

The size of pores more than 6 microns is not economically feasible because of loss of strength of the base in the roll technology of the coating formation.

Therefore, each of the essential features is necessary, and their summation is sufficient to achieve the novel quality not inherent in the features taken separately.

The main point of the invention is illustrated by the following method of the production of the above-mentioned material.

The present invention for the first time worked out the physical model of the formation of the high-adhesion layer of metal to the polymer surface, and the offered structure of metal-film anode for electrolytic capacitor is experimentally realized.

The surface of the polyethylene terephthalate film is being sequentially treated in vacuum chambers equipped with lockage devices, rewound at the speed sufficient for practical realization in production.

First, the surface of the film base of the composite material is being treated in the atmosphere of mixture of nitrogen and oxygen by means of ionic emitter under anode acceleration voltage of 2 kV, discharge current of 2 A, solenoid current of 200 mA, and as a result the development of the surface of the polyester film occurs.

The produced development of the surface has been estimated by means of scanning probe microscope "FemtoScan" in atom-power regime and other well-known methods to determine roughness, area of the real and geometrical surface, correlation of which determines the development factor.

There in the film base, by means of gas-discharge plasma and ion beam, the riffles 0.2-3 microns deep or pores of size 0.2-6 microns are formed, of total volume of 10-60%, and ⅓-⅕ part of the pores is made all the way through, achieving the factor of the base surface development to be in the range of 8-40.

After that in atmosphere of cyclohexane vapor occurs the ion-stimulated deposition of nanodimensional (10-50 nm) coating of sp3-hybridization from amorphous carbon, and as a result the modified film material acquires properties of electrets.

The application of this coating is made by means of ion-plasmous source ICI-4-0.15 from cyclohexane vapor under anode acceleration voltage of 3 kV, discharge current of 200 mA, solenoid coil current of 2 A.

After the nanodimensional diamond-like coating is laid upon the base film surface, dielectric permeability is increased, and the potential barrier of transfer to metal-dielectric is formed. The increase of dielectric permeability is connected with the increase of volumetric electro-conductivity of the film.

The multiple development of the surface of interaction of the polyester base with this technological nanolayer of the coating has noticeably increased the adhesion, provided for their firm cohesion into the integrated structure, to which the current-carrying layer of metal, copper or aluminum is to be further applied.

The nanodimesional coating on carbon base, deposited onto the modified surface of the polyester film, has a substantial influence upon the process of the film disruption, leading to the increase of the critical value of the electric field (intensity of the field where the disruption takes place) by 1.5-1.7 times with the increase of the coating thickness from 5 to 50 nm correspondingly. This, in turn, allows to considerably increase the nominal parameters and serviceability of the metal-film capacitors.

Then the current-carrying metal coating 25-250 nm thick is laid onto the formed diamond-like nanolayer by means of magnetron.

As a result the achieved adhesion of metal to polymer is 14-20 times higher than that of the prior art.

The metal layer hermetically seals up from two sides the pores of the base where the vacuum space remains, and the vacuum space during the use of anodes functions as rivets in the material, and in addition it mechanically presses the metal coating to the polymeric film base.

When the film polyester base remains permeable, that is the large pores are covered by the layer of deposited metal from within, and surfaces are opened on the end, there in the polymeric base the closed circular layers of the coating metal coherent with the base are formed, and this is to provide for the geometrical locking of the current-carrying layer, which is physically adjoined to the modified film and practically is not exposed during exploitation.

There the following regime of metallization of the modified film by the source of magnetron type has been chosen: discharge voltage—600 V, discharge current—10 A, pressure in the chamber filled with argon, comes to 0.001 ton. The travel speed of tape along the plant came to 0.3 m/min.

Then this bearing metal layer is additionally deposited over with the functional layer of porous metal 0.5-20 microns thick, which under the influence of the "information matrix" of the modified base is formed in the form of pyramidal structure with the factor of the surface development in the range of 80-400.

The technological regimes of production of the offered composite multi-layer material with different combinations of the structural layers with different geometrical parameters are worked through in the experimental plant and optimized in accordance with the data of the investigations of the electro-physical properties of anodes, according to the operating conditions.

The disclosed film material with wide range of the electrophysical properties is meant for using in microelectronics and radio engineering in the capacity of the universal constructional material.

High values of the electric charge, stable at temperatures up to 200° C. allow using of the modified polyester film in the capacity of the cheaper sensing element of the electro-mechanical and electro-acoustic transformers. The sensitivity of such a transformer is identical to the sensitivity of device with magnetic ferroelectrics made from polyvinyl den-fluoride, and its cost is considerably lower.

The modified surface of the polyester film with the diamond-like coating is bactericidal, and this helps to reduce the speed of biological corrosion during the exploitation of electronics in the extreme conditions.

The material of the invention may be used in capacity of secondary filter for different yielding materials, liquids, aerosols and gases.

The comparative analysis of the offered technical solution, carried out with the ascertained analogues of the technical level from which the invention is not obvious for the technologist of production of semi-conductors, has shown that the invention is not known, and taking into consideration the possibility of the industrial full-scale production of the metal-film anodes for electrolytic capacitors it is possible to draw a conclusion about its patentability.

The invention claimed is:

1. A polyester-based film comprising:
a polyester base made predominantly from polyethylene terephthalate, the surface of the polyester base being developed by means of ion radiator in a mixture of oxygen and nitrogen;
a metal coating, a surface of the metal coating being porous; and
a diamond-like adhesive layer 5-50 nm thick created between the surface of the polyester base and the metal coating, the diamond-like adhesive layer having a barrier function.

2. The polyester-based film of claim 1, wherein the diamond-like adhesive layer is a sp3-hybridization of atoms of amorphous carbon, the amorphous carbon being deposited in vacuum by stimulation of ions of cyclohexane vapor by an ion-plasmous source.

3. The polyester-based film of claim 1, wherein the porous surface of the metal surface is 0.5-20 microns thick and has a factor of surface development in the range of 80-400.

4. The polyester-based film of claim 1, wherein the surface of the polyester base is developed prior to applying the diamond-like adhesive layer by creating, in the surface of the polyester base, riffles and/or pores of size 0.2-6 microns and of total volume of 10-60%.

5. The polyester-based film of claim 4, wherein the riffles are 10-30 nanometers deep.

6. The polyester-based film of claim 4, wherein $\frac{1}{3}$-$\frac{1}{5}$ of all pores are made all the way through the polyester base.

7. The polyester-based film of claim 6, further comprising a layer of metal coating on the other side of the polyester base resulting in a two-sided metal coating, wherein the pores made all the way through the polyester based provide for locking of the two-sided metal coating.

8. The polyester-based film of claim 1, wherein the barrier function includes preventing diffusion of active constituents of the polyester base into the metal coating, thus stabilizing electro-physical characteristics of the polyester-based film.

9. The polyester-based film of claim 1, wherein the porosity of the surface of the metal coating increases electrode capacity of the polyester-based film by increasing an area of contact with an electrolyte, the electrode capacity of the polyester-based film being combined with high adhesion of the developed surface of the polyester base resulting in high durability of the polyester-based film being used as the anode of an electrolytic capacitor.

10. The polyester-based film of claim 1, wherein the surface development by means of ion radiator in a mixture of oxygen and nitrogen results in a destruction of carbonyl groups of the surface of the polyester base and an increase in roughness of the surface of the polyester base. thereby improving cohesion of the surface to the diamond-like adhesive layer.

11. The polyester-based film of claim 1, wherein the diamond-like adhesive layer possesses semi-conducting properties which increase dielectric permeability of the film.

12. A method for making a polyester-based film, the method comprising:
developing a surface of a polyester base of the polyester-based film by means of an ion radiator in a mixture of oxygen and nitrogen;
forming, in the polyester base, by means of a gas-discharge plasma and an ion beam, riffles or pores, a plurality of the pores being made all the way through the polyester based, thereby achieving the factor of the base surface development in a range of 8-40 times of an undeveloped surface of the polyester base;
coating the surface of the polyester base with a diamond-like adhesive layer 5-50 nm thick, the diamond-like adhesive layer being an sp3-hybridization of amorphous carbon produced by an ion-stimulated deposition in an atmosphere of cyclohexane vapor and applied to the surface of the polyester base by means of ion-plasmous source;
applying a metal coating to the diamond-like adhesive layer by means of a magnetron, the metal coating hermetically sealing the pores of the polyester; and
applying to the metal coating, a metal layer with a developed surface.

13. The method of claim 12, wherein the ion-plasmous source has an anode acceleration voltage of 3 kV, a discharge current of 200 mA, and a solenoid coil current of 2A.

14. The method of claim 12, wherein the coating of the surface of the polyester base with the diamond-like adhesive layer increases dielectric permeability of the polyester-based film due to an increase of volumetric electro-conductivity.

15. The method of claim 12, wherein the metal coating includes one or more of the following metals: copper and aluminum.

16. The method of claim 12, wherein the metal coating is 25-250 nm thick.

17. The method of claim 12, wherein the riffles are 0.2-3 microns deep.

18. The method of claim 12, wherein the pores are of size 0.2-6 microns.

19. The method of claim 12, wherein a volume of the riffles and pores is 10-60% of the volume of the polyester base.

20. The method of claim 12, wherein $\frac{1}{3}$-$\frac{1}{5}$ of all pores are made all the way through.

* * * * *